(12) United States Patent  (10) Patent No.: US 7,747,405 B2
Meagher et al.  (45) Date of Patent: Jun. 29, 2010

| | | | | |
|---|---|---|---|---|
| (54) | LINE FREQUENCY SYNCHRONIZATION | 4,679,028 A | 7/1987 | Wilson .................... 341/120 |
| | | 5,128,625 A | 7/1992 | Yatsuzuka et al. .......... 327/156 |
| (75) | Inventors: Thomas Bruce Meagher, Houston, TX (US); Kenneth John Murphy, Henderson, NV (US); Linda Murphy, legal representative, Henderson, NV (US) | 5,293,082 A | 3/1994 | Bathaee .................... 327/108 |
| | | 5,324,989 A | 6/1994 | Thornton et al. ........... 307/35 |
| | | 5,552,881 A | 9/1996 | Jezwinski et al. .......... 356/73.1 |
| | | 5,594,439 A | 1/1997 | Swanson ................... 341/118 |
| | | 5,621,603 A | 4/1997 | Adamec et al. ............ 361/154 |

(73) Assignee: ICS TRIPLEX Technology Ltd., Essex (GB)

(Continued)

FOREIGN PATENT DOCUMENTS ( * ) Notice: Subject to any disclaimer, the term of this patent is extended or adjusted under 35 U.S.C. 154(b) by 15 days.

DE   19750349   5/1998

(21) Appl. No.: 11/689,281

(Continued)

(22) Filed: Mar. 21, 2007

OTHER PUBLICATIONS

(65) Prior Publication Data

European Search Report for European Application 06114802.9, Sep. 5, 2006, European Patent Office.

US 2008/0036511 A1    Feb. 14, 2008

(Continued)

Related U.S. Application Data

*Primary Examiner*—Mohamed Charioui
(74) *Attorney, Agent, or Firm*—Boyle Fredrickson LLP; William R. Walbrun

(60) Provisional application No. 60/785,537, filed on Mar. 24, 2006.

(30) Foreign Application Priority Data

(57) ABSTRACT

May 31, 2006    (EP)    ................... 06114804

(51) Int. Cl.
*G01R 35/04*    (2006.01)
(52) U.S. Cl. .................................. 702/106
(58) Field of Classification Search .................. 702/57, 702/58, 64, 75–77, 79, 87, 89, 106, 125, 702/126, 178, 183, 188–191, 193; 370/207; 348/730; 375/344; 455/502; 341/61, 120, 341/155; 361/3
See application file for complete search history.

This invention relates to line frequency synchronisation for use in diagnostics for alternating current electrical circuits. The invention provides a method of synchronising measurement system frequency with an alternating current line frequency comprising the steps of: adjusting the frequency of the measurement system frequency using a frequency locked loop until the measurement system frequency is within a predetermined range of said alternating current line frequency; and when the measurement system frequency is within a predetermined range of said alternating current line frequency adjusting the phase and the frequency of the measurement system frequency using a phase and frequency locked loop.

(56) References Cited

U.S. PATENT DOCUMENTS 4,535,378 A    8/1985    Endo et al. .................... 361/18
4,539,683 A    9/1985    Hahn et al. ................... 341/120

5 Claims, 5 Drawing Sheets

U.S. PATENT DOCUMENTS

| | | | | |
|---|---|---|---|---|
| 5,671,147 | A * | 9/1997 | McKim et al. | 702/77 |
| 5,774,321 | A | 6/1998 | Kim et al. | 361/94 |
| 5,828,710 | A * | 10/1998 | Beale | 375/344 |
| 5,867,014 | A | 2/1999 | Wrathall et al. | 323/316 |
| 5,896,263 | A | 4/1999 | Terdan et al. | 361/101 |
| 5,909,660 | A | 6/1999 | Foote et al. | 702/189 |
| 6,061,006 | A | 5/2000 | Hopkins et al. | 341/61 |
| 6,125,024 | A | 9/2000 | LeComte et al. | 361/104 |
| 6,304,582 | B1 * | 10/2001 | Zhang et al. | 370/503 |
| 6,320,283 | B1 | 11/2001 | Salim et al. | 307/125 |
| 6,351,835 | B1 | 2/2002 | Sakaguchi | 714/724 |
| 6,400,163 | B1 | 6/2002 | Melcher et al. | 324/713 |
| 6,459,599 | B1 | 10/2002 | Agirmann et al. | 363/84 |
| 6,557,131 | B1 | 4/2003 | Arabi | 714/734 |
| 6,594,129 | B1 | 7/2003 | Baba et al. | 361/87 |
| 6,653,963 | B1 | 11/2003 | Barrenscheen et al. | 341/155 |
| 6,657,464 | B1 | 12/2003 | Balardeta et al. | 327/147 |
| 6,768,350 | B1 | 7/2004 | Dickey | 327/108 |
| 6,771,590 | B1 * | 8/2004 | Marchok et al. | 370/207 |
| 7,219,037 | B2 * | 5/2007 | Pupalaikis et al. | 702/189 |
| 2003/0043521 | A1 | 3/2003 | Thiele | 361/104 |
| 2003/0063679 | A1 | 4/2003 | Scrofano | 375/260 |
| 2004/0125007 | A1 | 7/2004 | Pezzini | 341/155 |
| 2005/0135037 | A1 | 6/2005 | Thiery et al. | 361/94 |
| 2005/0154945 | A1 | 7/2005 | Haag et al. | 714/724 |
| 2005/0174273 | A1 | 8/2005 | Luo et al. | 341/120 |
| 2005/0248477 | A1 | 11/2005 | Jongsma et al. | 341/110 |
| 2006/0061303 | A1 | 3/2006 | Takeda et al. | 315/300 |
| 2006/0215064 | A1 * | 9/2006 | Dawson et al. | 348/730 |
| 2007/0155413 | A1 * | 7/2007 | Kerstenbeck | 455/502 |

FOREIGN PATENT DOCUMENTS

| | | |
|---|---|---|
| EP | 0325786 | 8/1989 |
| EP | 0789458 | 8/1997 |
| EP | 1322139 | 6/2003 |
| EP | 1545163 | 6/2005 |
| GB | WO3107019 | 12/2003 |
| JP | 55096708 | 7/1980 |
| JP | 60236073 | 1/1985 |
| JP | 08023244 | 1/1996 |

OTHER PUBLICATIONS

European Search Report for European Application 06114803.7, Sep. 1, 2006, European Patent Office.
European Search Report for European Application 06114806.0, Aug. 30, 2006, European Patent Office.
European Search Report for European Application 06114800.3, Sep. 1, 2006, European Patent Office.
European Search Report for European Application 06114804.5, Aug. 18, 2006, European Patent Office.
European Search Report for European Application 06114805.2, Aug. 24, 2006, European Patent Office.
European Search Report for European Application 06114801.1, Sep. 11, 2006, European Patent Office.
Sigma-Delta-ADC in Software, Design&Elektronik, Product Brochure, 1998, pp. 1-18, XP002398239.

* cited by examiner

LINE FREQUENCY SYNCHRONIZATION

CROSS-REFERENCE TO RELATED APPLICATIONS

This application is related to and claims priority from U.S. Provisional Application No. 60/785,537 filed Mar. 24, 2006 entitled Fault Detection and Apparatus, which is incorporated fully herein by reference

BACKGROUND a. Field of the Invention

This invention relates to line frequency synchronisation for use in diagnostics for alternating current electrical circuits, in particular it relates to line frequency synchronisation for use in safety control systems.

In safety control systems, fault tolerance is of utmost importance. Fault tolerance is the ability to continue functioning in the event of one or more failures within the system.

Fault tolerance may be achieved by a number of different techniques, each with its specific advantages and disadvantages. One example of fault tolerance is known as Hardware Implemented Fault Tolerance (HIFT). HIFT means that the system relies on robust hardware circuits (as opposed to complex software algorithms) to perform the fault detection and redundancy management functions. A significant advantage HIFT has over software-implemented fault tolerance is that HIFT eliminates the overhead for communications between processors, leaving more time for controlling the process. This makes HIFT systems significantly faster and more dependable than systems using software-implemented fault tolerance.

An example of a HIFT system is a system which provides redundancy, in particular Triple Modular Redundancy (TMR). Using TMR, critical circuits are triplicated and perform identical functions simultaneously and independently. The data output from each of the three circuits is voted in a majority-voting circuit, before affecting the system's outputs. If one of the triplicated circuits fails, its data output is ignored. However, the system continues to output to the process the value (voltage, current level, or discrete output state) that agrees with the majority of the functional circuits. TMR provides continuous, predictable operation.

HIFT and TMR provides for automatic fault recovery with no disruption to system operation and ensures minimal fault detection periods.

Another approach to fault tolerance is the use of hot-standby modules. This approach provides a level of fault tolerance whereby the standby module maintains system operation in the event of module failure. With this approach there may be some disruption to system operation during the changeover period if the modules are not themselves fault-tolerant.

Fault tolerant systems ideally create a Fault Containment Region (FCR) to ensure that a fault within the FCR boundary does not propagate to the remainder of the system. This enables multiple faults to co-exist on different parts of a system without affecting operation.

Fault tolerant systems generally employ dedicated hardware and software test and diagnostic regimes that provide very fast fault recognition and response times to provide a safer system.

Commonly, it is possible to repair faults without interrupting system operation (known as hot replacement). For example active and standby module may operate in parallel so that if an active module becomes faulty there is an automatic change over to a standby module.

Safety control systems are generally designed to be 'fail-operational/fail-safe'. Fail operational means that when a failure occurs, the system continues to operate: it is in a fail-operational state. The system should continue to operate in this state until the failed module is replaced and the system is returned to a fully operational state.

An example of fail safe operation occurs, for example if, in a TMR system, a failed module is not replaced before a second failure in a parallel circuit occurs, the second failure should cause the TMR system to shut down to a fail-safe state.

Typical safety control applications include emergency and safety shutdown systems, process control, reactor control, wellhead control, turbine and compressor control, fire and gas detection and abatement, and are applicable to many industries including oil and gas production and refining, chemical production and processing, power generation, paper and textile mills and sewage treatment plants.

SUMMARY OF THE INVENTION

According to the invention there is provided a method of synchronising measurement system frequency with an alternating current line frequency comprising the steps of: adjusting the frequency of the measurement system frequency using a frequency locked loop until the measurement system frequency is within a predetermined range of said alternating current line frequency; and when the measurement system frequency is within a predetermined range of said alternating current line frequency adjusting the phase and the frequency of the measurement system frequency using a phase and frequency locked loop.

Preferably, said frequency locked loop is controlled in dependence upon the difference between measurement system frequency and frequency generated from a Fast Fourier Transform (FFT) of said alternating current line frequency.

In a preferred embodiment said predetermined range is defined by the precision of said FFT and is equal to one FFT frequency bin.

Preferably the frequency and phase locked loop is controlled in dependence upon the difference between measurement system frequency and phase generated from a Discrete Fourier Transform of said alternating current line frequency.

Preferably, the measurement system frequency is used to synchronously monitor an alternating current digital output switch.

BRIEF DESCRIPTION OF THE DRAWINGS

The invention will now be described, by way of example only, with reference to the accompanying drawings in which.

DETAILED DESCRIPTION

Figure 1:
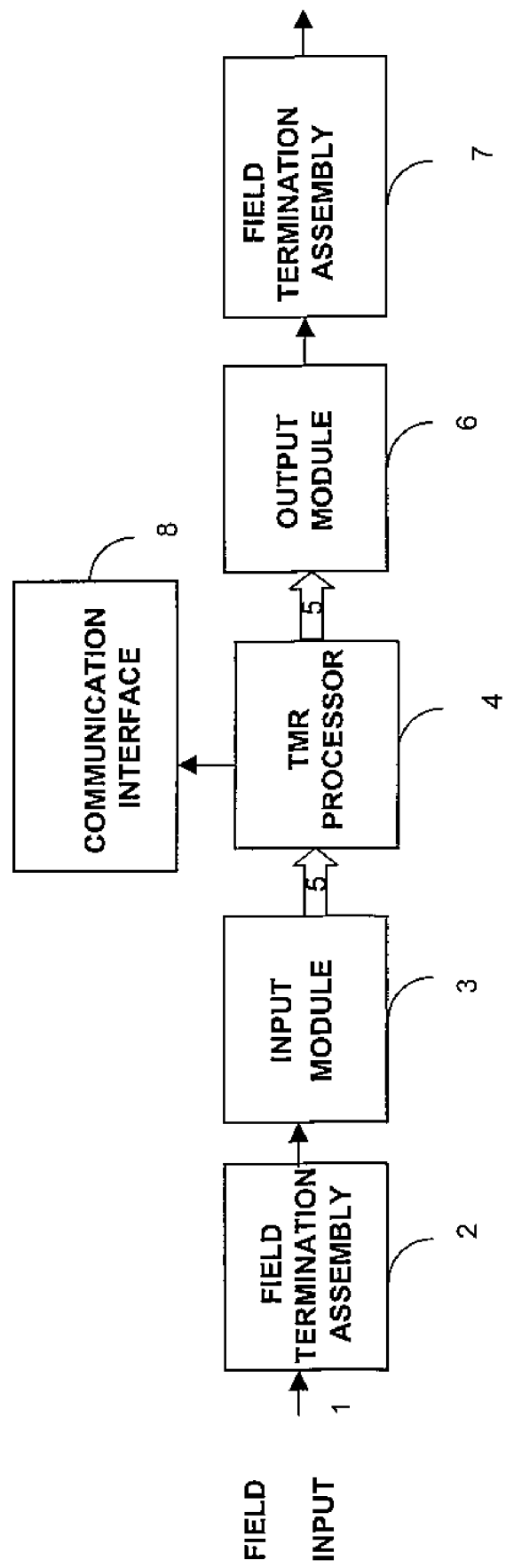
FIG. 1 illustrates schematically a fault tolerant architecture.

Referring now to FIG. 1, signals 1 from an input field device (not shown) are connected to the system via an input Field Termination Assembly (FTA) 2. An input 3 module receives, buffers and carries out any necessary conversion of the input data from the field device. The input data is then transmitted over a triplicated Inter-Module Bus (IMB) 5 to a TMR processor 4. Triplicated microprocessors of the TMR processor receive the input data from each channel of the IMB 5 and carry out a majority vote of the data. During data processing, each of the three processors compares and majority votes its input data against that of the other two processors. The processors synchronously execute the application program, and the derived output data is transmitted back to the IMB. An output module 6 receives, majority votes, and carries out any necessary conversion of the output data from the TMR processor 4. The output circuits are then driven by the majority-voted command. The output signals are connected to a field device (not shown) via an output FTA 7. A communications interface 8 provides facilities to allow systems to be networked using peer to peer communications links, the collection of Sequence of Events (SOE) data, and connection to other systems.

If an internal circuit in the system fails, it is simply voted out. Comprehensive distributed voting both out-votes failures, preventing them from being propagated into the process, and simplifies the process of identifying where faults have occurred.

For safety systems it is beneficial for line monitored analogue and digital input modules to detect open circuit faults between the Field Termination Assembly (FTA) and the input module itself. The requirement also exists that any fault in the components of each input circuit should be detectable.

Figure 2:
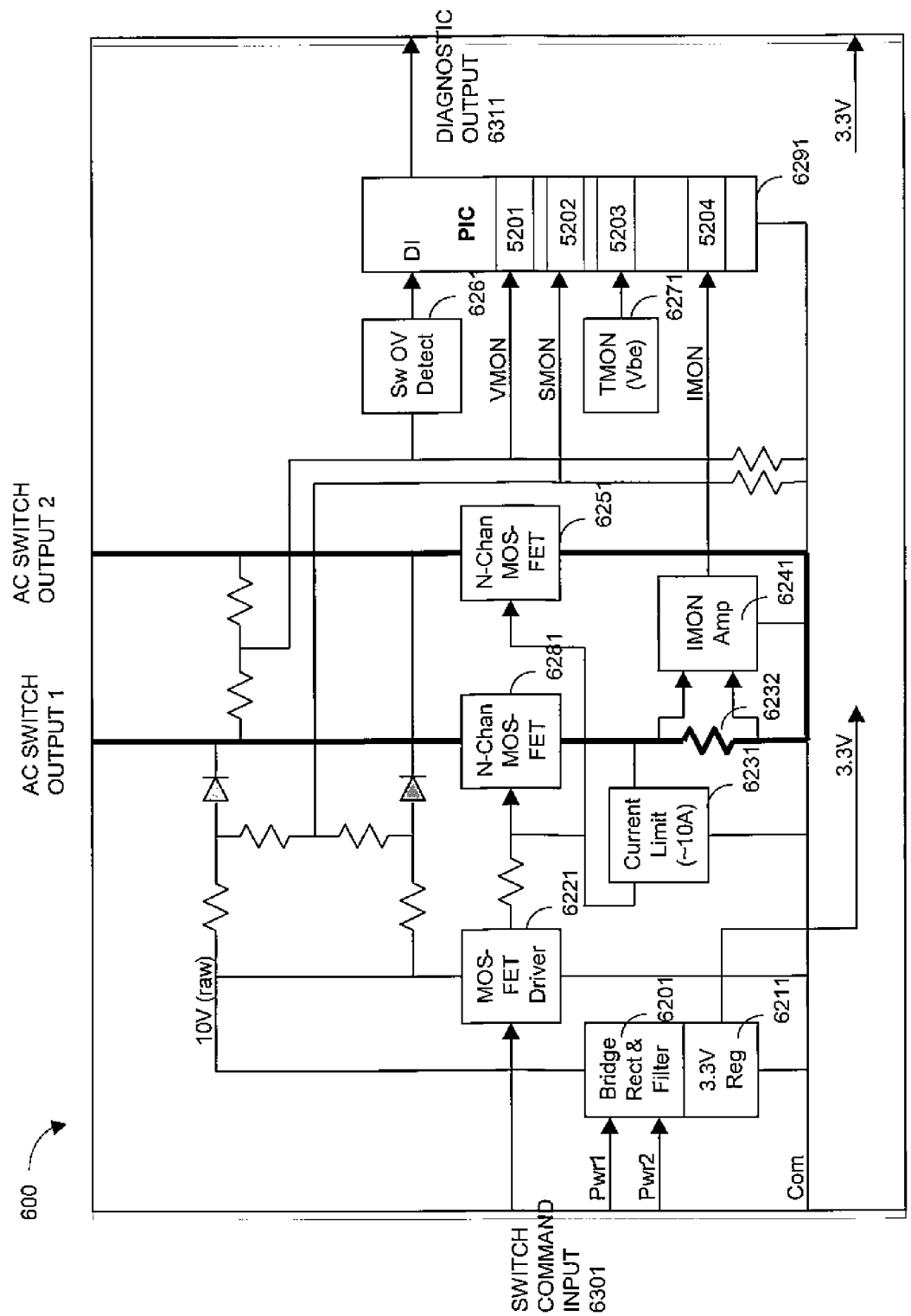
FIG. 2 is a block diagram illustrating a fault tolerant AC digital output module switch section.

FIG. 2 illustrates an alternating current output switch. A binary input signal 6301 indicates whether the AC switch output is to be enabled or disabled.

A driver 6221 receives the input signal and drives two back-to-back FET output transistors 6281, 6251 in dependence upon the received signal 6301.

A transformer isolated high frequency AC input power signal differential pair (Pwr1 and Pwr2) are rectified and regulated by a bridge rectifier and filter 6201 and a voltage regulator 6211 to generate isolated 10V and 3.3V power supplies for various components.

The voltage across the FET output transistors 6281, 6251 is measured by the signal VMON and the current through the FET output transistors 6281, 6251 is measured by the signal IMON.

A switch monitor signal SMON measures the change in test voltage across the switch when it is periodically turned on and off and a temperature monitor 6271 monitors circuit board temperature and sends signal TMON to the FPGA controller (not shown) via diagnostic monitor 6291.

A/D converters 5201, 5203, 5203, 5204 convert the analogue signals to a binary digital data stream.

These diagnostic signals are sent elsewhere for analysis. However, it is important for accurate analysis that any diagnostic analysis is synchronous with the frequency of the input power signals. Samples are accumulated during each quadrant of the AC cycle in a conventional manner to enhance the resolution and reduce the noise level, so a trigger at four times the AC line frequency is required.

The method of this invention allows accurate line frequency synchronisation for this purpose.

Power line frequencies over the range of 47 Hz to 63 Hz are initially acquired by using a closed loop Fast Fourier Transform (FFT) based measurement of the line frequency. A digital frequency synthesizer is controlled using data from the FFT until the rate of change of phase is sufficiently small.

This provides the coarse control necessary to acquire an arbitrary frequency line signal. When the digital frequency synthesizer control loop has converged to within the limit of resolution of the FFT, then a quadrature based DFT signal processing algorithm is engaged. This allows the sample rate of the diagnostic system to be precisely locked to the incoming power line frequency, typically to within +/−0.1 degrees.

The quadrature values are used to compute the real and imaginary components of the current and voltage signals, which are then converted to polar coordinates.

This allows the magnitude and phase of the channel current signals to be computed to a high degree of accuracy. The line voltage and frequency are also measured very accurately due to the synchronous nature of the phase locked measurement subsystem.

Figure 3:
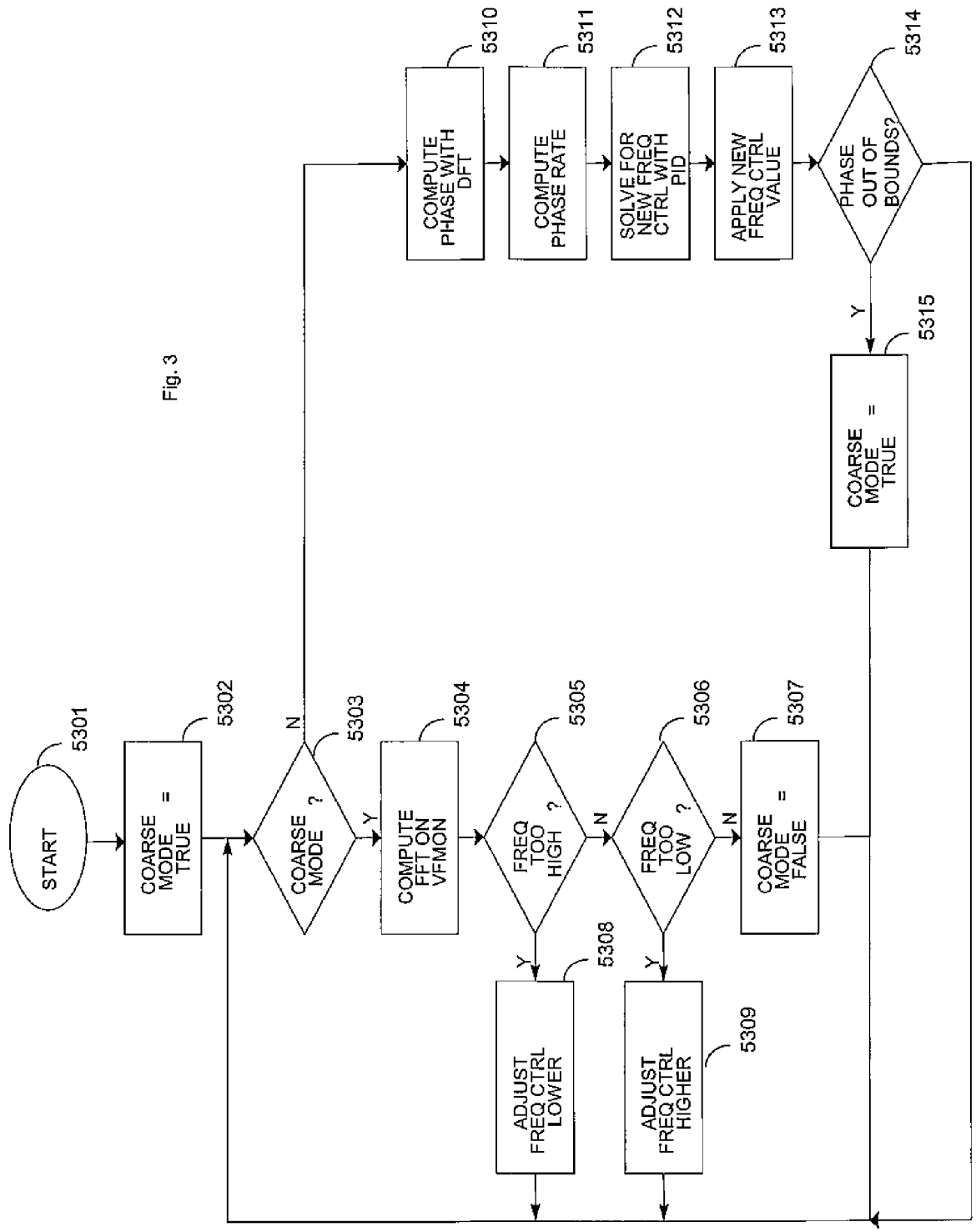
FIG. 3 is a flow chart illustrating a method of frequency synchronisation.

The method of frequency synchronisation is described in more detail with reference to FIG. 3.

The measurement system sample frequency rate is generated by a synthesized frequency controlled by a control register as will be described later with reference to FIG. 4. The goal is to match the sample rate frequency generator to be exactly 4 times the AC line frequency, and in zero phase with respect to it. When it is in lock, the frequency synthesizer control register will just dither around the exact unattainable perfect value by a small amount.

A binary variable is used to determine whether the algorithm is currently operating in coarse mode, which is the default at system start up, or when phase lock has been lost.

At step 5302 the binary variable coarse mode is set to be true. If the algorithm is currently in coarse mode at step 5303 a frequency locked loop including steps 5304-5309 is executed otherwise a frequency and phase locked loop including steps 5310-5315 is executed.

For the initial acquisition, only the relative frequencies of the synthesised frequency and the measured frequency are compared and the frequency of the measuring system is adjusted until it shows the line frequency of approximately 25% of the sample rate. When this has been achieved, the systems are coarsely locked. i.e. frequency locked, but their relative phases will still be moving in relation to each other. However, the rate of change of phase will be then sufficiently low, because we are close enough in frequency, to take it to the next level and adjust the measurement system frequency using a phase error signal.

For example, if the measured and synthesised frequencies are within 1 Hz of each other, then the phase only changes by 360 degrees per second.

But if the synthesised frequency is 10 Hz away from the measured frequency, the phases would slide at 3600 degrees per second, and with a relatively slow system sample rate of four times the desired lock frequency, sample to sample changes can be so large that it is impossible to tell in which direction the phase is changing.

The rate of change of phase must be slow enough to unambiguously determine the direction before phase lock adjustment can be attempted. The coarse frequency lock loop control achieves this.

When in coarse mode at step 5304 a FFT is computed for the monitored voltage. Data from the FFT is used to generate a synthesised frequency (sample rate) which is then compared to the monitored frequency.

Precision of an FFT is determined by a number of frequency bins and the sampling frequency for example for a 32 point FFT (ie one which results in 32 frequency bins) and a sampling rate of 100 Hz each bin contains a range of 50 HZ (ie the maximum measurable frequency)/32=1.56 Hz.

The result of the computed FFT will have sharp spike in amplitude at the bin which contains line frequency. Ideally this would be the bin representing the frequency at 50% of the Nyquist frequency. If the peak bin is located above the 50% bin, then the sample rate is too slow. If the peak bin is located below the 50% bin then the sample rate is too high. So the goal is to adjust the sample rate so that the FFT bin with the most energy is the one that is at 50% of the Nyquist frequency (or 25% of the sample rate). In a 32 point FFT, this would be the 16th bin.

So for example, for a 50-60 Hz line frequency sampled at 100 Hz and resolved with a 32 point FFT coarse mode is maintained until the synthesised frequency is within less than 2 Hz of the goal.

At step 5305 if the frequency is too high the frequency of the synthesised voltage is decreased at step 5308. Otherwise if it is too low at step 5306 the frequency of the synthesised voltage is increased at step 5309. Once the frequency is within ½ the Nyquist frequency of the monitored voltage coarse mode is set to false at step 5307.

Once the algorithm is no longer in coarse mode (ie the synthesised frequency is close enough to the desired frequency) the phase of the monitored line frequency is computed using a Discrete Fourier Transform (DFT). Once the phase has been determined new frequency control register values are computed to fine control the synthesised measurement frequency.

If at step 5314 it is determined that the phase difference between the synthesised measurement frequency and the monitored line voltage frequency is too great the algorithm reverts to coarse mode by resetting the variable coarse mode at step 5315.

Figure 4:
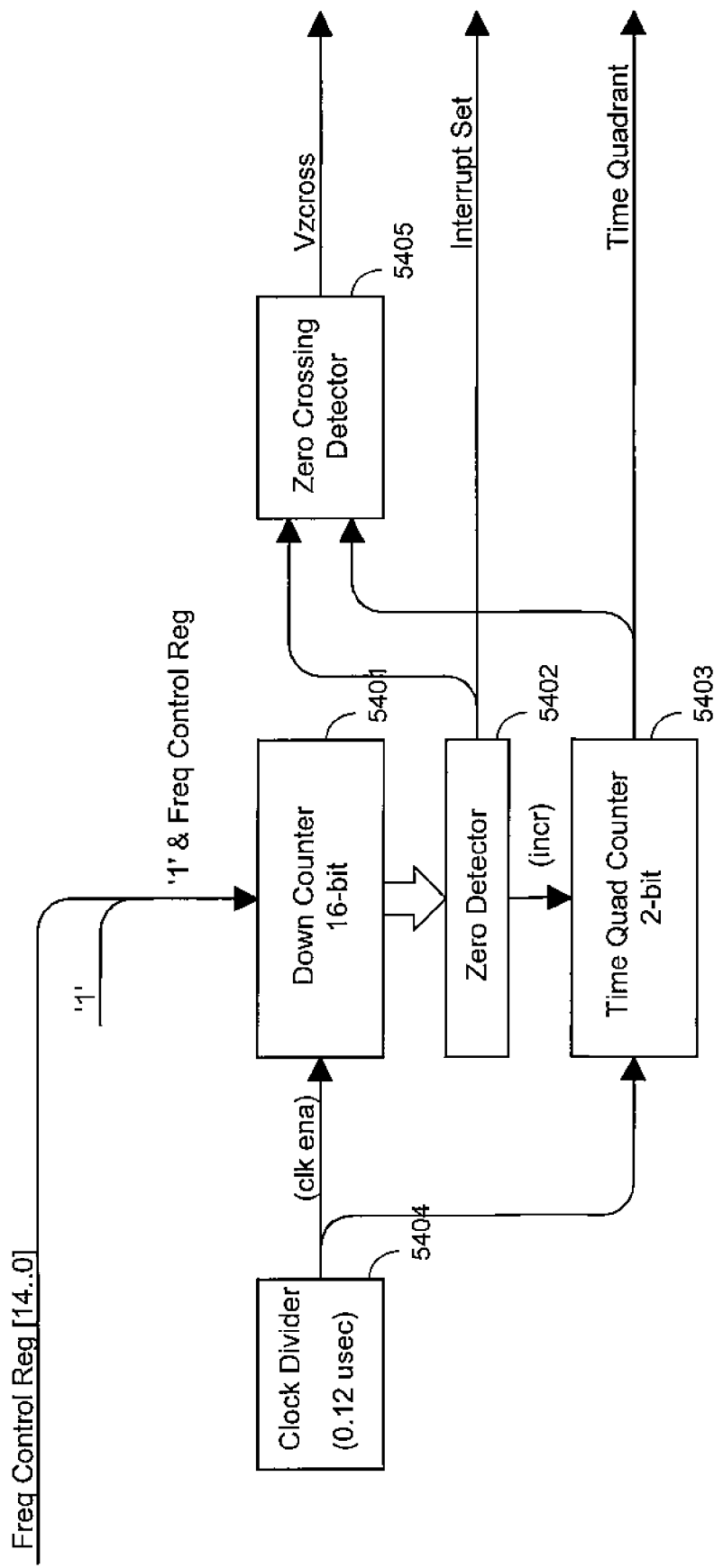
FIG. 4 is a block diagram illustrating the architecture of an interrupt generator.

FIG. 4 illustrates the operation of the interrupt generation for the diagnostic software.

A 16-bit Down Counter 5401 is decremented every 0.12 µs by a clock divider 5404. and upon reaching zero which is detected by a zero detector 5402 it is reloaded from the Freq Control Register which sets the count period and contains a value in dependence upon the frequency control values computed during frequency and phase locking.

The upper bit is hard-coded to one (1) so that the operating range is constrained to a safe region—if the period of the frequency control circuit is too close to zero the frequency becomes extremely high. An interrupt is generated when the Down Counter is loaded.

Figure 5:
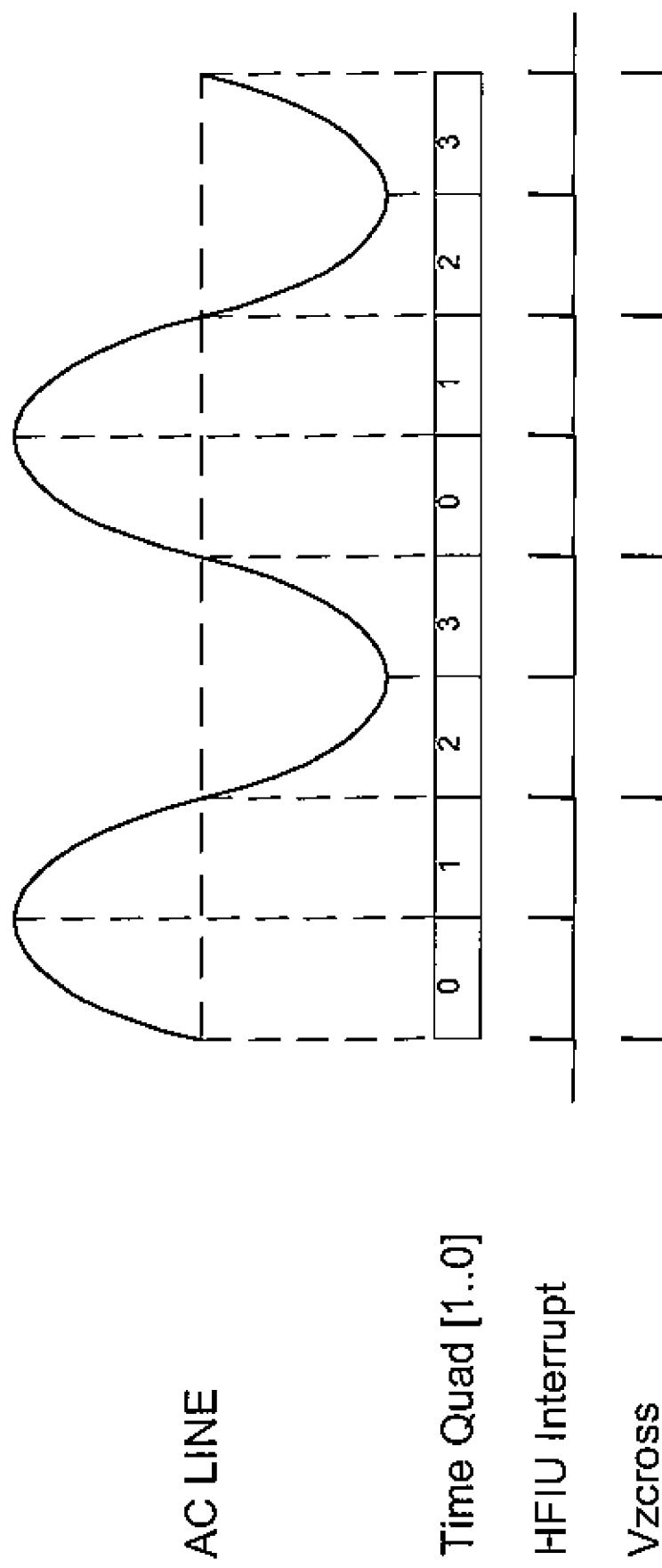
FIG. 5 is an illustration of interrupts in relation to line frequency.

As shown in FIG. 5, the interrupts are phased to the ¼ cycle AC timing. The microprocessor performs a control algorithm based on the monitored AC line voltage VFMON and adjusts the period as described above to keep the interrupts phased to the AC line.

A Time Quadrant counter 5403 provides a 2-bit index for each ¼ cycle period. The microprocessor adjusts the period so that TQ0 starts with the first ¼ cycle.

Vzcross marks the AC voltage zero-crossings and is used by the switch command control logic to align any switch ON/OFF transitions with an AC zero crossing.

It is to be recognised that various alterations, modifications, and/or additions may be introduced into the constructions and arrangements of parts described above without departing from the scope of the present invention as defined in the following claims.

The invention claimed is:

1. A method of synchronising measurement system frequency, for fault detection in a control system circuit, with an alternating current power-line frequency in a range of 47 Hz to 63 Hz comprising the steps of:
adjusting the frequency of the measurement system frequency using a frequency locked loop until the measurement system frequency is within a predetermined range of said alternating current power-line frequency; and
when the measurement system frequency is within said predetermined range of said alternating current power-line frequency adjusting the phase and the frequency of the measurement system frequency using a phase and frequency locked loop;
measuring diagnostic signals from the control system circuit according to the timing of the measurement system frequency to detect open circuit faults in the control system circuit with respect to a switched alternating current power-line at the alternating current power-line frequency.

2. A method according to claim 1 in which said frequency locked loop is controlled in dependence upon the difference between measurement system frequency and frequency generated from a Fast Fourier Transform of said alternating current power-line frequency.

3. A method according to claim 2, in which said predetermined range is defined by the precision of said FFT and is equal to one FFT frequency bin.

4. A method according to claim 1, in which said frequency and phase locked loop is controlled in dependence upon the difference between measurement system frequency and phase generated from a Discrete Fourier Transform of said alternating current power-line frequency.

5. A method according to claim 1, in which the measurement system frequency is used to synchronously monitor an alternating current digital output switch.

* * * * *